United States Patent
Kashiwada et al.

(10) Patent No.: US 10,213,895 B2
(45) Date of Patent: Feb. 26, 2019

(54) POLISHING PAD AND METHOD FOR MANUFACTURING SAME

(71) Applicant: FUJIBO HOLDINGS, INC., Chuo-ku, Tokyo (JP)

(72) Inventors: Hiroshi Kashiwada, Saijo (JP); Kenichi Koike, Saijo (JP); Shin Tokushige, Saijo (JP)

(73) Assignee: FUJIBO HOLDINGS, INC., Chuo-Ku, Tokyo (JP)

( * ) Notice: Subject to any disclaimer, the term of this patent is extended or adjusted under 35 U.S.C. 154(b) by 128 days.

(21) Appl. No.: 14/902,060

(22) PCT Filed: Jul. 1, 2014

(86) PCT No.: PCT/JP2014/067552
§ 371 (c)(1),
(2) Date: Dec. 30, 2015

(87) PCT Pub. No.: WO2015/002199
PCT Pub. Date: Jan. 8, 2015

(65) Prior Publication Data
US 2016/0136779 A1 May 19, 2016

(30) Foreign Application Priority Data
Jul. 2, 2013 (JP) ................................ 2013-139041

(51) Int. Cl.
*B24B 37/24* (2012.01)
*H01L 21/02* (2006.01)
*H01L 21/322* (2006.01)
*B24D 3/28* (2006.01)

(52) U.S. Cl.
CPC ............... *B24B 37/24* (2013.01); *B24D 3/28* (2013.01); *H01L 21/02013* (2013.01); *H01L 21/3221* (2013.01)

(58) Field of Classification Search
CPC .................................. B24B 37/24; B24D 3/28
USPC ........... 451/533, 534, 526; 51/297, 298, 293
See application file for complete search history.

(56) References Cited

U.S. PATENT DOCUMENTS

| | | |
|---|---|---|
| 2004/0247852 A1 | 12/2004 | Kume et al. |
| 2005/0255674 A1 | 11/2005 | Nanjo |
| 2005/0276967 A1* | 12/2005 | Prasad ............... B24B 37/24 428/314.8 |
| 2006/0046064 A1 | 3/2006 | Halberg et al. |
| 2006/0046627 A1 | 3/2006 | Renteln et al. |
| 2006/0099891 A1 | 5/2006 | Renteln |
| 2006/0208329 A1 | 9/2006 | Nanjo |
| 2007/0184757 A1 | 8/2007 | Kume et al. |
| 2009/0017729 A1 | 1/2009 | Halberg et al. |

FOREIGN PATENT DOCUMENTS

| | | |
|---|---|---|
| JP | 2001-332517 A | 11/2001 |
| JP | 2002-154050 A | 5/2002 |
| JP | 2002-231669 A | 8/2002 |
| JP | 2004-358584 A | 12/2004 |
| JP | 2005-72150 A | 3/2005 |
| JP | 2005-317846 A | 11/2005 |
| JP | 2007-242902 A | 9/2007 |
| JP | 2008-511181 A | 4/2008 |
| JP | 2010-225987 A | 10/2010 |
| JP | 2010-228009 A | 10/2010 |
| JP | 2011-235419 A | 11/2011 |
| JP | 2012-223875 A | 11/2012 |

OTHER PUBLICATIONS

International Search Report (PCT/ISA/210) dated Sep. 22, 2015, by the Japanese Patent Office as the International Searching Authority for International Application No. PCT/JP2014/067552.
Written Opinion (PCT/ISA/237) dated Sep. 22, 2014, by the Japanese Patent Office as the International Searching Authority for International Application No. PCT/JP2014/067552.
Notification of Reasons for Refusal issued by the Japanese Patent Office in corresponding Japanese Patent Application No. 2015-525239 dated Sep. 11, 2017 (8 pages including partial English translation).

* cited by examiner

*Primary Examiner* — Robert Rose
(74) *Attorney, Agent, or Firm* — Buchanan, Ingersoll & Rooney PC

(57) ABSTRACT

A polishing pad comprising a resin-containing polishing cloth having a polishing cloth base impregnated with a polyurethane resin and silicon carbide, wherein the silicon carbide has a particle diameter in a range from 0.2 to 3.0 μm, and the content of the silicon carbide in the resin-containing polishing cloth is in a range from 60 to 500 parts by mass relative to 100 parts by mass of the polishing cloth base.

12 Claims, No Drawings

POLISHING PAD AND METHOD FOR MANUFACTURING SAME

TECHNICAL FIELD

The present invention relates to a polishing pad and a method for manufacturing the polishing pad. Especially, the present invention relates to a polishing pad for polishing a back surface of a silicon wafer and a method for manufacturing the polishing pad.

BACKGROUND ART

For manufacturing semiconductor devices, it is necessary to conduct the thinning process for reducing the thickness to 100 micrometers or less and/or stress relief and also to form a gettering layer. Here, the stress relief means removal of damage on a ground surface of a wafer caused by grinding, and the gettering means trapping of contaminant metal ions in the environment.

Conventionally, the gettering layer has been formed by dry polishing using a polishing pad of a fixed-abrasive grain type or a grinding wheel. For example, Patent Document 1 discloses that a strained layer which provides sites for the gettering of metal impurities is formed by polishing a back surface of a semiconductor wafer by using fixed abrasive grains. Meanwhile, Patent Document 2 discloses a method for carrying out a gettering process by grinding a back surface of a semiconductor device with a grinding wheel obtained by bonding diamond abrasive grains having a particle diameter of 4 μm or less with a bonding material. Patent Document 3 discloses a processing method preferable for forming a gettering layer by polishing a back surface of a wafer with a polishing member in which abrasive grains having an average particle diameter of 5 μm or less are dispersed.

However, all of the grinding wheel and the like used in Patent Documents 1 to 3 are designed for polishing (dry-polishing) a semiconductor wafer without using a slurry. Hence, the formation of a gettering layer by the dry polishing of each of Patent Documents 1 to 3 is disadvantageous in that dust is formed during the polishing. In addition, when the polishing member of Patent Document 3 is used, it is necessary to conduct the thinning process and stress relief by conducting polishing or etching in steps before the formation of the gettering, which causes problems in terms of operation efficiency and costs.

Meanwhile, regarding a polishing pad used not for a dry polishing method but for a wet polishing method, for example, Patent Document 4 discloses a polishing pad in which abrasive grains and alkali particles are included in a foamed polyurethane. With the polishing pad, a gettering layer is formed on a back surface of a wafer by using pure water as a polishing liquid.

However, the polishing pad described in Patent Document 4 is made of foamed polyurethane, and hence has closed cells. Thus, the polishing pad tends to have a problem of clogging by polishing dust or the like. In addition, the polishing pad described in Patent Document 4 is disadvantageous in that the resin used for the foamed polyurethane has a high hardness and thus a thinned wafer tends to be cracked.

CITATION LIST

Patent Literatures

Patent Literature 1: Japanese Patent Application Publication No. 2005-72150

Patent Literature 2: Japanese Patent Application Publication No. 2005-317846

Patent Literature 3: Japanese Patent Application Publication No. 2007-242902

Patent Literature 4: Japanese Patent Application Publication No. 2010-225987

SUMMARY OF INVENTION

Problem to be Solved

The present invention has been made in view of the above-described problems of the conventional technologies, and an object of the present invention is to provide a polishing pad with which the polishing (thinning process and stress relief) of a back surface of a silicon wafer can be carried out and also a gettering layer can be formed.

Means for Solving the Problem

To achieve the above-described object, the present inventors have intensively studied especially polishing pads using polishing cloths, and consequently found that the use of silicon carbide having a specific particle diameter in a polishing pad comprising a resin-containing polishing cloth having a polishing cloth base impregnated with a resin and silicon carbide makes it possible to obtain a polishing pad with which a thinning process and stress relief of a back surface of a silicon wafer can be carried out and also a gettering layer can be formed. This finding has led to the completion of the present invention.

Specifically, the present invention provides the following:
<1> A polishing pad comprising a resin-containing polishing cloth having a polishing cloth base impregnated with a polyurethane resin and silicon carbide, wherein
the silicon carbide has a particle diameter (hereinafter, a particle diameter here refers to a median diameter) in a range from 0.2 to 3.0 μm, and
the content of the silicon carbide in the resin-containing polishing cloth is in a range from 60 to 500 parts by mass relative to 100 parts by mass of the polishing cloth base.
<2> The polishing pad according to the above-described <1>, which is used to wet-polish a back surface of a semiconductor wafer.
<3> The polishing pad according to the above-described <1> or <2>, wherein
the content of the polyurethane resin in the resin-containing polishing cloth is in a range from 10 to 500 parts by mass relative to 100 parts by mass of the polishing cloth base.
<4> The polishing pad according to any one of the above-described <1> to <3>, wherein
the polishing cloth base is a nonwoven fabric.
<5> The polishing pad according to any one of the above-described <1> to <4>, further comprising a cushion layer laminated on a surface of the resin-containing polishing cloth on a side opposite from a polishing surface of the resin-containing polishing cloth.
<6> A method for manufacturing the polishing pad according to any one of the above-described <1> to <5>, comprising the steps of:
preparing a polyurethane resin solution containing a polyurethane resin and silicon carbide;
impregnating a polishing cloth base with the polyurethane resin solution; and
immersing the polishing cloth base impregnated with the polyurethane resin solution in a coagulation liquid to coagulate the polyurethane resin.

Advantageous Effects of Invention

The present invention makes it possible to provide a polishing pad with which a back surface of a silicon wafer can be polished and a gettering layer can be formed.

DESCRIPTION OF EMBODIMENTS

<<Polishing Pad>>

A polishing pad of the present invention comprises a resin-containing polishing cloth having a polishing cloth base impregnated with a polyurethane resin and silicon carbide (SiC) (hereinafter, the resin-containing polishing cloth is also referred to as a polishing layer), wherein the silicon carbide has a particle diameter in a range from 0.2 to 3.0 μm, and the content of the silicon carbide in the resin-containing polishing cloth is in a range from 60 to 500 parts by mass relative to 100 parts by mass of the polishing cloth base.

(Particle Diameter)

In Description and Claims, the "particle diameter" of silicon carbide means a median diameter.

The silicon carbide used in the polishing pad of the present invention has a particle diameter in a range from 0.2 to 3.0 μm. The particle diameter of the silicon carbide is preferably 0.25 to 1.5 μm, more preferably 0.3 to 1.0 μm, and further more preferably 0.3 to 0.8 μm.

When the particle diameter of the silicon carbide is within the above-described range, defects can be formed in the silicon crystal lattice without damaging the wafer, so that a gettering layer which provides a sufficient gettering performance can be formed.

(Blending Ratio)

In the polishing pad of the present invention, the content of the silicon carbide in the resin-containing polishing cloth is in a range from 60 to 500 parts by mass relative to 100 parts by mass of the polishing cloth base. The content of the silicon carbide is preferably in a range from 60 to 500 parts by mass, more preferably in a range from 80 to 400 parts by mass, and further more preferably in a range from 90 to 350 parts by mass, relative to 100 parts by mass of the polishing cloth base.

When the mass ratio of the silicon carbide is within the above-described range, defects in the silicon crystal lattice can be formed at a sufficient density, so that a gettering layer which provides a gettering performance can be formed.

In the polishing pad of the present invention, the content of the polyurethane resin in the resin-containing polishing cloth is preferably in a range from 10 to 500 parts by mass, more preferably in a range from 30 to 300 parts by mass, and further more preferably in a range from 80 to 250 parts by mass, relative to 100 parts by mass of the polishing cloth base.

When the mass ratio of the polyurethane resin is within the above-described range, the silicon carbide and fiber are embedded in the resin and are made less likely to fall off during a polishing process, so that a good polishing state can be obtained.

(Polishing Cloth Base)

Examples of the polishing cloth base used for manufacturing the polishing pad of the present invention include a nonwoven fabric, a woven fabric, a knitted fabric, and the like. The polishing cloth base is preferably a nonwoven fabric from the viewpoint of ease of adjustment of physical properties.

The nonwoven fabric is not particularly limited, and may be a nonwoven fabric manufactured from a natural fiber (including a modified fiber), a synthetic fiber, or the like. For example, it is possible to use a synthetic fiber such as a polyester fiber, a polyamide fiber, an acrylic fiber, or vinylon; a natural fiber such as cotton or hemp, a regenerated cellulose fiber such as rayon or triacetate, or the like. Among these, it is preferable to use a synthetic fiber having no water-absorbability (liquid-absorbability) such as a polyester fiber, considering the mass productivity, the uniformity of the raw material fiber, and the prevention of swelling of the raw material fiber due to absorption of an organic solvent such as DMF and a washing liquid such as water in a manufacturing process.

In addition, the fineness of the resin fiber is preferably 0.1 to 50 d (denier), and more preferably 1 to 20 d. The fiber length of the resin fiber is preferably 20 to 100 mm, and more preferably 30 to 80 mm.

The density of the polishing cloth base is preferably in a range from 0.05 to 0.30 $g/cm^3$, and more preferably in a range from 0.1 to 0.25 $g/cm^3$. When the density of the polishing cloth base is within the above-described range, the polyurethane resin is well attached to the fiber, and the fiber component is less likely to adversely affect the polishing characteristics.

(Polyurethane Resin)

The type of the polyurethane resin serving as a material of the polishing pad of the present invention is not particularly limited, and the polyurethane resin can be selected from various types of polyurethane resins according to the purpose of use. For example, one or two or more of polyester-based, polyether-based, or polycarbonate-based resins can be used.

Examples of the polyester-based resins include polymerization products of a polyester polyol, which may be formed from ethylene glycol, butylene glycol, or the like and adipic acid or the like, with a diisocyanate such as diphenylmethane-4,4'-diisocyanate. Examples of the polyether-based resins include polymerization products of a polyether polyol such as poly(tetramethylene ether) glycol or polypropylene glycol with an isocyanate such as diphenylmethane-4,4'-diisocyanate. Examples of the polycarbonate-based resins include polymerization products of a polycarbonate polyol with an isocyanate such as diphenylmethane-4,4'-diisocyanate. As those resins, commercially available resins may be used such as one manufactured by DIC Corporation under the trade name of "CRISVON", one manufactured by Sanyo Chemical Industries, Ltd. under the trade name of "SANPRENE", and one manufactured by Dainichiseika Color & Chemicals Mfg. Co., Ltd. under the trade name of "RESAMINE", or self-manufactured resins having desired characteristics may be used.

Of these resins, polyether-based polyurethane resins, which have high chemical stability, are particularly preferable.

(Modulus)

The polyurethane resin preferably has a resin modulus of 3 to 70 MPa, and the resin modulus is more preferably 25 to 60 MPa. When the resin modulus is within the above-described range, the polyurethane resin has an excellent ability to hold the silicon carbide, and polishing characteristics are stabilized because of self-disintegrability of the resin.

The resin modulus is an index of the hardness of a resin, and is a value obtained by dividing the load acting when a non-foamed resin sheet is elongated by 100% (elongated to a length which is twice the original length) by the cross-sectional area (hereinafter, this value is also referred to as a 100% modulus). A higher value means a harder resin.

(Other Components)

The resin-containing polishing cloth in the polishing pad of the present invention may contain other components in addition to the above-described components, unless an effect of the present invention is impaired. The other components include higher alcohols, polyether-based derivatives, fatty acids, fatty acid salts, cellulose derivatives, anionic surfactants, cationic surfactants, amphoteric surfactants, nonionic surfactants, paraffins, organic silicones, carbon, organic pigments, inorganic pigments, antioxidants, and the like. The other components in the polishing cloth are preferably contained at a ratio of 20 parts by mass or less and more preferably contained at a ratio of 5 parts by mass or less relative to 100 parts by mass of the polishing cloth base.

<Physical Properties of Polishing Pad>

(Density)

In the polishing pad of the present invention, the density of the resin-containing polishing cloth obtained by impregnation with the polyurethane resin and the silicon carbide is preferably in a range from 0.20 to 1.00 g/cm$^3$, and more preferably in a range from 0.30 to 0.65 g/cm$^3$. When the density of the resin-containing polishing cloth is within the above-described range, physical properties preferable for a polishing material can be obtained, the wearing of the pad during polishing is reduced, and good polishing characteristics last for a long period.

(A Hardness)

In Description and Claims, an A hardness means a value measured according to JIS K7311.

The A hardness of the resin-containing polishing cloth in the polishing pad of the present invention is preferably 50 to 85 degrees, and more preferably 60 to 80 degrees. When the A hardness is within the above-described range, scars are easily formed because of the moderate hardness, and the occurrence of uneven polishing and chipping can be reduced.

(Compression Ratio)

In Description and Claims, a compression ratio is an index of the softness of a polishing pad.

The compression ratio can be obtained according to Japanese Industrial Standard (JIS L 1021) by using a Schopper-type thickness gauge (pressure surface: circular surface with a diameter of 1 cm). Specifically, the compression ratio can be determined as follows.

An initial load is applied to a polishing pad having been placed in an unloaded state, and 30 seconds later the thickness $t_0$ of the polishing pad is measured. Next, a final load is applied to the polishing pad having been placed in the state of the thickness $t_0$, and 5 minutes later the thickness $t_1$ is measured. The compression ratio can be calculated using the formula: compression ratio (%)=100×($t_0$−$t_1$)/$t_0$. Note that the initial load is 100 g/cm$^2$, and the final load is 1120 g/cm$^2$.

The polishing pad of the present invention has a compression ratio (%) of preferably 0.5 to 20%, and more preferably 1.0 to 11.0%. When the compression ratio is within the above-described range, the polishing pad stably comes into contact with a wafer, so that good polishing characteristics can be obtained.

(Compressive Elastic Modulus)

In Description and Claims, a compressive elastic modulus is an index of recoverability of a polishing pad from compressive deformation.

The compressive elastic modulus can be determined according to Japanese Industrial Standard (JIS L 1021) by using a Schopper-type thickness gauge (pressure surface: circular surface with a diameter of 1 cm). Specifically, the compressive elastic modulus can be determined as follows.

An initial load is applied to a polishing pad having been placed in an unloaded state, and 30 seconds later the thickness $t_0$ of the polishing pad is measured. Next, a final load is applied to the polishing pad having been placed in the state of the thickness $t_0$, and 5 minutes later the thickness $t_1$ is measured. Next, all load is removed from the polishing pad having been placed in the state of the thickness $t_1$, and the polishing pad is left for 5 minutes (placed in an unloaded state). Then, the initial load is again applied for 30 seconds, and then the thickness $t_0'$ is measured. The compressive elastic modulus can be calculated by using the formula: compressive elastic modulus (%)=100×($t_0'$−$t_1$)/($t_0$−$t_1$). Note that the initial load is 100 g/cm$^2$, and the final load is 1120 g/cm$^2$.

The polishing pad of the present invention has a compressive elastic modulus (%) of preferably 20 to 100%, and more preferably 40 to 90%. When the compressive elastic modulus is within the above-described range, deformation of the pad due to a polishing load can be reduced, and a state where polishing characteristic are stable can be kept.

(Thickness)

The thickness of the resin-containing polishing cloth in the polishing pad of the present invention is not particularly limited, and can be about 0.5 to 10.0 mm, for example.

<<Additional Layer>>

The polishing pad of the present invention may have an additional layer (underlying layer, supporting layer) laminated on a surface on a side opposite from a surface (polishing surface) for polishing an object of the resin-containing polishing cloth. The type of the additional layer is not particularly limited, and a cushion layer may be laminated, for example.

In Description and Claims, the cushion layer means a layer having an A hardness not higher than that of the polishing layer. The provision of the cushion layer reduces the influences of the hardness and the flatness of a platen, and can prevent a workpiece from being contacted with the polishing surface nonuniformly. Accordingly, the life of the polishing pad can be extended, and chipping (chipping of a peripheral portion of a workpiece) can be prevented.

As a material of the cushion layer, a resin-impregnated nonwoven fabric, a synthetic rubber, a polyethylene foam, a polyurethane foam, or the like can be used.

The thickness of the cushion layer is not particularly limited, and is preferably 0.1 to 10 mm. The thickness of the cushion layer is more preferably about 0.5 to 3 mm, because mechanical limitations due to a polishing mechanism can be avoided, and influences of the polishing platen can be reduced sufficiently.

When the polishing pad has a multi-layer structure, the multiple layers may be bonded or fixed to each other by using a double-sided tape, an adhesive agent, or the like, if necessary, under pressure. The double-sided tape or the adhesive agent used here is not particularly limited, and any one selected from double-sided tapes and adhesive agents known in this technical field can be used.

(Applications)

The polishing pad of the present invention can be used as a polishing pad for wet-polishing a workpiece (an object to be polished). In Description and Claims, the wet polishing refers to a polishing method in which a polishing process is conducted by using a slurry, water, or the like, and is clearly distinguished from the dry polishing in which a polishing process is conducted by bringing a polishing pad into direct contact with a workpiece (an object to be polished) without using a slurry, water, or the like.

The polishing pad of the present invention can be used particularly preferably as a polishing pad for wet-polishing a back surface of a silicon wafer; a semiconductor wafer of SiC, GaAs, GaN, or the like; or a wafer based on a compound such as sapphire. Here, the back surface means a surface of a wafer on a side opposite from a surface on which semiconductor elements are formed.

Silicon carbide used in the present invention is very difficult to handle (since it is high in mechanical polishing properties, poor in dispersibility, high in sedimentation rate, and difficult in waste liquid disposal). Hence, for example, when a gettering is formed on a back surface of a semiconductor wafer while dropping a slurry containing silicon carbide as abrasive grains to a conventional polishing pad, it is necessary to increase the mechanical load in order to improve the dispersibility of the silicon carbide. However, when the mechanical load is increased, the silicon carbide polishes the mechanical surfaces of a tube and the like during a period where the slurry is transferred through the tube and the like to the surface of the polishing pad, causing contamination due to abrasion of the apparatus. In addition, silicon carbide has a high sedimentation rate, and hence has such a problem that handling of silicon carbide itself is difficult.

The same problems occur in the case of using a polishing pad of a foamed polyurethane type including silicon carbide. Specifically, in the case of the polishing pad of the foamed polyurethane type, the dispersibility of the silicon carbide is further worsened, because the silicon carbide has to be mixed with the high-viscosity resin. Accordingly, this necessitates the increase in mechanical load to increase the dispersibility, and the mechanical abrasion due to the silicon carbide becomes more likely to occur. As a result, contamination of the polishing pad occurs, which adversely affects the polishing and the formation of a gettering.

On the other hand, in the case of the polishing pad of the present invention, the silicon carbide is contained in the polishing cloth. Hence, the problems, which occur when silicon carbide is used in a slurry, do not occur. In other words, in the case of the polishing pad of the present invention, silicon carbide is dispersed in the resin solution, and then the polishing cloth base is impregnated with the resin solution. For this reason, it is possible to uniformly disperse the silicon carbide without increasing the mechanical load. Consequently, the contamination due to the abrasion of the apparatus is less. It is also unnecessary to pay attention to the sedimentation rate of the silicon carbide. Moreover, because of the self-disintegrability, the polishing surface can be regenerated by conditioning with a dresser, and effects of the present invention can be retained for a long period.

The polishing pad of the present invention can be manufactured preferably by the following method.

<<Method for Manufacturing Polishing Pad>>

A method for manufacturing a polishing pad of the present invention comprises the steps of: preparing a polyurethane resin solution containing a polyurethane resin and silicon carbide; impregnating a polishing cloth base with the polyurethane resin solution; and immersing the polishing cloth base impregnated with the polyurethane resin solution in a coagulation liquid to coagulate the polyurethane resin. In addition, the silicon carbide preferably has a particle diameter in a range from 0.2 to 3.0 µm.

<Step of Preparing Resin Solution>

In this preparation step, a polyurethane resin solution containing a polyurethane resin and silicon carbide is prepared. As the resin serving as a raw material, the resins described in the above-described section <<Polishing Pad>> can be used. In addition, a solvent in which the resin is dissolved may be N,N-dimethylformamide (DMF), N,N-dimethylacetamide (DMAc), tetrahydrofuran (THF), dimethyl sulfoxide (DMSO), acetone, acetonitrile, N-methylpyrrolidone (NMP), or the like, or a mixture of them. Of these solvents, DMF is preferable.

The silicon carbide may be added to the solvent before or after the resin is dissolved in the solvent. This makes it possible to uniformly disperse the silicon carbide in the resin solution without aggregation.

The amount of the polyurethane resin added to the solvent is preferably 10 to 100 parts by mass, and more preferably 10 to 30 parts by mass, relative to 100 parts by mass of the solvent.

The amount of the silicon carbide added to the solvent is preferably 10 to 100 parts by mass, and more preferably 20 to 70 parts by mass, relative to 100 parts by mass of the solvent.

<Impregnation Step>

Next, a polishing cloth base is prepared, and the polishing cloth base is immersed in the polyurethane resin solution. The temperature and time of the immersion treatment are not particularly limited, as long as the polishing cloth base is sufficiently soaked with the polyurethane resin solution. For example, the polishing cloth base may be immersed at about 5 to 40° C. for about 1 to 30 minutes.

<Coagulation Step>

Next, the polyurethane resin is coagulated by a wet coagulation method.

The wet coagulation method is a method in which the resin is coagulated and regenerated in such a manner that a polishing cloth base such as a nonwoven fabric is impregnated with a resin solution, and the impregnated polishing cloth base is immersed in an aqueous coagulation liquid containing water as a main component, which is a poor solvent for the resin. In the coagulation liquid, the exchange between the solvent (for example, DMF) of the resin solution and the coagulation liquid proceeds on the surface of the resin solution attached to the fibers of the nonwoven fabric, so that the resin is coagulated and regenerated on the surfaces of the fibers.

As the coagulation liquid, water, a mixture solution of water and a polar solvent such as DMF, or the like is used. Especially, water or a mixture solution of water and a polar solvent such as DMF is preferable. The polar solvent may be a water-miscible organic solvent, for example, such as DMF, DMAc, THF, DMSO, NMP, acetone, IPA (isopropyl alcohol), ethanol, or methanol. In addition, the concentration of the polar solvent in the mixture solvent is preferably 0.5 to 60% by mass.

The temperature of the coagulation liquid or the time of immersion in the coagulation liquid is not particularly limited, and, for example, the polishing cloth base may be immersed at 10 to 50° C. for 30 to 1440 minutes.

The polishing pad obtained by the manufacturing method of the present invention is obtained by impregnating the polishing cloth base with the resin, followed by wet coagulation. Hence, the polishing pad has a cushioning property, and it is possible to prevent a semiconductor wafer from being broken during polishing.

<Washing and Drying Steps>

The polishing cloth base obtained by the coagulation by the treatment in the coagulation bath is washed and dried.

By the washing treatment, the solvent remaining in the polyurethane resin solution is removed. A washing liquid used for the washing may be water.

After the washing, the polyurethane resin is subjected to a drying treatment. The drying treatment may be conducted by a conventionally employed method, and, for example, the polyurethane resin may be dried in a dryer at 60 to 120° C. for about 10 to 500 minutes. Through the above-described steps, the resin-containing polishing cloth (polishing layer) can be obtained.

In addition, after the drying, a buffing treatment or a slicing treatment may be conducted on one surface or both surfaces of the resin-containing polishing cloth.

<<Polishing of Semiconductor Wafer (Formation of Gettering Layer)>>

For polishing a back surface of a semiconductor wafer and forming a gettering layer with the polishing pad of the present invention can be collectively carried out in a single step by, for example, setting the polishing pad of the present invention and a semiconductor wafer to a polishing machine, and polishing the semiconductor wafer, while dropping a polishing agent to the polishing pad, and while pressing the semiconductor wafer to the polishing pad. As the polishing agent, a dispersion liquid of colloidal silica, alumina, zirconium oxide, diamond, boron nitride, silicon carbide, or the like can be used.

Alternatively to the above-described method, it is also possible to conduct the thinning and stress relief by using a polishing agent such as colloidal silica or alumina and the polishing pad of the present invention, and then form a gettering layer with the polishing agent being replaced with water or the like. In this method, the polishing of the back surface of the semiconductor wafer and the formation of the gettering layer can be conducted continuously by using a single type of polishing pad.

EXAMPLES

Polishing pads were manufactured through the following steps.

<<Manufacturing of Polishing Pads>>

Polishing pads of Comparative Example 1, Examples 1 to 5, and Comparative Examples 1 to 3 were each manufactured by the following steps.

<I. Manufacturing of Polishing Layer>

(1) A nonwoven fabric (Name of fiber: polyester, fineness: 3 d, fiber length: 51 mm) (density: 0.104 g/cm$^3$) was prepared.

(2) An abrasive grain-containing polyurethane resin solution was prepared in which SiC was added as abrasive grains to a solution obtained by dissolving a thermoplastic polyether-based polyurethane resin (100% modulus: 47 MPa) in DMF. Note that the mass ratios of DMF, the polyurethane resin, and SiC in resin solutions used in Examples 1 to 5 and Comparative Examples 1 to 3 were as shown in Tables 1 and 2.

(3) The above-described nonwoven fabric of (1) was impregnated with the above-described abrasive grain-containing polyurethane resin solution of (2) at 25° C. for 3 minutes. After that, wet coagulation was conducted by using water as a coagulation liquid at 18° C. for 60 minutes, followed by washing and drying. In this manner, a polishing layer was obtained.

TABLE 1

|  | Ex. 1 | Ex. 2 | Ex. 3 | Ex. 4 |
| --- | --- | --- | --- | --- |
| DMF (parts by mass) | 100 | 100 | 100 | 100 |
| Polyurethane resin (parts by mass) | 20 | 20 | 20 | 20 |
| SiC (parts by mass) | 46 | 46 | 46 | 46 |

TABLE 2

|  | Ex. 5 | Comp. Ex. 1 | Comp. Ex. 2 | Comp. Ex. 3 |
| --- | --- | --- | --- | --- |
| DMF (parts by mass) | 100 | 100 | 100 | 100 |
| Polyurethane resin (parts by mass) | 20 | 20 | 20 | 20 |
| SiC (parts by mass) | 46 | 46 | 8 | 0 |

<II. Manufacturing of Cushion Layer>

(1) A nonwoven fabric (Name of fiber: polyester) (fineness: 3 d, fiber length: 51 mm, density: 0.217 g/cm$^3$) was prepared.

(2) A solution was prepared in which a thermoplastic polyether-based polyurethane resin (100% modulus: 9 MPa) was dissolved in DMF.

(3) The nonwoven fabric of (1) was impregnated with the polyurethane resin solution of (2). After wet coagulation was conducted, washing and drying were conducted. Then, a buffing treatment was conducted to obtain a desired thickness. In this manner, a cushion layer was manufactured.

In the obtained cushion layer, the ratio of the amount of the fiber to the amount of the resin was 67.8:32.2, and the obtained cushion layer had a thickness of 1 mm, a density of 0.320 g/cm$^3$, and an A hardness of 51 degrees.

<III. Manufacturing of Polishing Pads>

(1) Polishing Pads Having No Cushion Layer (Examples 1 to 4 and Comparative Examples 1 to 3)

Polishing pads of Examples 1 to 4 and Comparative Examples 1 to 3 were each obtained by attaching a double-sided tape onto one surface of the corresponding polishing layer obtained in the above-described I.

(2) Polishing Pad Having a Cushion Layer (Example 5)

The polishing layer and the cushion layer obtained in the above-described I and II were stacked on each other and fixed to each other with a double-sided tape. Then, a double-sided tape was attached to a surface of the cushion layer on the side opposite from the surface bonded to the polishing layer. In this manner, a polishing pad of Example 5 was obtained.

In this manner, polishing pads of Examples 1 to 5 and Comparative Examples 1 to 3 were obtained. Tables 5 and 6 show the particle size and the particle diameter of the SiC abrasive grains, the mass ratio of constituents, and the thickness of the polishing layer of each of Examples and Comparative Examples.

<<Physical Properties>>

Tables 5 and 6 show the density, the A hardness, the compression ratio, the compressive elastic modulus, and the thickness of each of the polishing pads of Examples 1 to 5 and Comparative Examples 1 to 3. Note that the compression ratio and the compressive elastic modulus of Example 5 were measured with the polishing layer and the cushion layer being laminated on each other. The values of the other physical properties were those measured for the polishing layer alone.

(Density in g/cm³)

The weight (g) of a sample cut into a piece having a predetermined size was measured, and the volume (cm³) was determined from the size to calculate the density.

(A Hardness)

The A hardness was measured according to JIS K7311.

(Compression Ratio %)

Measurement was conducted and the compression ratio was calculated according to JIS L1021.

Note that the initial load was 100 g/cm², and the final load was 1120 g/cm².

(Compressive Elastic Modulus %)

Measurement was conducted and the compressive elastic modulus was calculated according to JIS L1021.

Note that the initial load was 100 g/cm², and the final load was 1120 g/cm².

(Thickness)

The thickness of each polishing pad was measured according to the thickness measuring method described in Japanese Industrial Standard (JIS K6505). Specifically, the thickness of the polishing pad was measured with an initial load of 480 g/cm² being applied to the polishing pad in the thickness direction. The polishing pad was cut into three pieces with a thickness of 10 cm and a width of 10 cm. The thicknesses of each piece were measured at four corners and a center portion by using a dial gauge, and the average value of the five points was employed as the thickness of the piece. As the average thickness of each polishing pad, an average value of the thus measured thicknesses of three pieces was employed.

<<Evaluation>>

Polishing was conducted by using each of the polishing pads of Examples 1 to 5 and Comparative Examples 1 to 3 by the polishing method described below, and evaluation was made as to the polishing rate, the scar density, and the presence or absence of defective scars. Tables 5 and 6 show the results.

(Polishing Method)

A silicon wafer and a polishing pad were set to a polishing machine (MCP-150X manufactured by FUJIKOSHI MACHINERY CORP.), and the silicon wafer was polished, while a polishing agent was being dropped to the polishing pad.

The polishing agent used was a 3:7 mixture of CON-POL80 (manufactured by Fujimi Incorporated) and water, and was dropped to the polishing pad at 200 ml/min. The rotation speed of the platen was 80 rpm. The pressure at which the silicon wafer was pressed to the polishing pad with a pressure head was 300 g/cm². Note that the silicon wafer used was 6 inches (152.4 mm in diameter), and the polishing time was 10 minutes.

Next, the surface of the pad was slightly dressed with a #200 diamond dresser, and pure water was dropped to the polishing pad at 200 ml/min. A gettering layer was formed by a treatment under the same conditions as described above.

Note that, to obtain a more uniform gettering layer, the polishing using pure water was conducted as described above. However, the polishing using pure water may be omitted according to the required quality of the gettering layer.

(Polishing Rate)

The difference between the masses of the silicon wafer before and after the polishing was determined by using an analytical electronic balance (GH-300 manufactured by A&D Company, Limited). This value was divided by the product of the Si density (g/cm³) and the surface area (cm²), and the obtained value was converted to a value in μm. Then, the obtained value was divided by the polishing time to obtain the polishing rate (μm/min), which was evaluated according to the criteria shown in Table 3 below.

TABLE 3

| Evaluation | Polishing rate (μm/min) |
| --- | --- |
| A | 0.80 or higher |
| B | 0.60 or higher to lower than 0.80 |
| C | lower than 0.60 |

(Scar Density and Presence or Absence of Defective Scars)

The surface of the polished silicon wafer was visually evaluated with an optical microscope (dark field microscopy, 200 fold magnification) according to the criteria shown in Table 4 below.

Note that, in general, the surface of a wafer on which a gettering layer is formed looks like a mirror surface, but when the wafer is illuminated by light, scars become detectable. In contrast, defective scars are detectable even without illumination by light. Accordingly, the scars of the scar density mean scars which are detectable only under illumination by light, whereas the defective scars mean scars which are detectable even without illumination by light.

TABLE 4

| Evaluation | Detail |
| --- | --- |
| | Scar density |
| A | A scar density optimal for a gettering layer was observed. |
| B | A scar density suitable for a gettering layer was observed. |
| C | Fine scars were scarce, and the layer was unsuitable as a gettering layer |
| | Defective scars |
| A | No scars regarded as defects were observed. |
| C | Scars regarded as defects were observed. |

TABLE 5

Specs, physical property values, and polishing characteristic values of polishing layer

|  |  | Example 1 | Example 2 | Example 3 | Example 4 |
|---|---|---|---|---|---|
| SiC abrasive grains | Particle size | 6000 | 10000 | 30000 | 10000 |
|  | Particle diameter (μm) | 2.0 | 0.6 | 0.32 | 0.6 |
| Amounts (parts by mass) of resin and SiC relative to 100 parts by mass of nonwoven fabric |  |  |  |  |  |
| Polyurethane resin |  | 120 | 120 | 120 | 120 |
| Silicon carbide (SiC) |  | 280 | 280 | 280 | 100 |
| <<Physical properties>> |  |  |  |  |  |
| Density (g/cm$^3$) |  | 0.520 | 0.524 | 0.515 | 0.343 |
| A hardness (Degrees) |  | 71.0 | 72.0 | 71.5 | 67.5 |
| Compression ratio (%) |  | 6.2 | 6.9 | 6.1 | 8.2 |
| Compressive elastic modulus (%) |  | 58.4 | 55.5 | 52.1 | 62.7 |
| Thickness (mm) |  | 3.32 | 3.31 | 3.28 | 3.31 |
| <<Evaluation>> |  |  |  |  |  |
| Polishing rate |  | A (0.93) | A (0.91) | A (0.88) | A (0.91) |
| Scar density |  | B | A | A | B |
| Defective scars |  | A | A | A | A |

TABLE 6

Specs, physical property values, and polishing characteristic values of polishing layer

|  |  | Example 5 | Comp. Ex. 1 | Comp. Ex. 2 | Comp. Ex. 3 |
|---|---|---|---|---|---|
| SiC abrasive grains | Particle size | 10000 | 3000 | 10000 | — |
|  | Particle diameter (μm) | 0.6 | 4.0 | 0.6 | — |
| Amounts (parts by mass) of resin and SiC relative to 100 parts by mass of nonwoven fabric |  |  |  |  |  |
| Polyurethane resin |  | 120 | 120 | 120 | 120 |
| Silicon carbide (SiC) |  | 280 | 280 | 50 | 0 |
| <Physical properties> |  |  |  |  |  |
| Density (g/cm$^3$) |  | 0.531 | 0.511 | 0.310 | 0.244 |
| A hardness (Degrees) |  | 70.0 | 71.0 | 61.0 | 54.5 |
| Compression ratio (%) |  | 5.8 | 6.2 | 7.6 | 9.7 |
| Compressive elastic modulus (%) |  | 58.1 | 50.1 | 60.2 | 75.3 |
| Thickness (mm) |  | 3.29 | 3.28 | 3.30 | 3.31 |
| <<Evaluation results>> |  |  |  |  |  |
| Polishing rate |  | A (0.90) | A (0.94) | C (0.54) | C (0.45) |
| Scar density |  | A | C | C | C |
| Defective scars |  | A | C | A | A |

As is apparent from Tables 5 and 6, in each of the cases (Comparative Examples 2 and 3) where the content ratio of silicon carbide was not in the range of 60 to 500 parts by mass relative to 100 parts by mass of the nonwoven fabric, the polishing rate was low, and the observed scar density was not suitable for a gettering layer. In addition, in the case (Comparative Example 1) where the content ratio of silicon carbide was in the range of 60 to 500 parts by mass relative to 100 parts by mass of the nonwoven fabric, but the particle diameter was not in the range of 0.2 to 3.0 μm, defective scars were formed.

On the other hand, each of the polishing pads of the present invention, which contained silicon carbide having a particle diameter of 0.2 to 3.0 μm at a ratio of 60 to 500 parts by mass relative to 100 parts by mass of the nonwoven fabric, had a high polishing rate, and had a scar density suitable for a gettering layer. In addition, no defective scars were present in the polishing pads (Examples 1 to 5).

INDUSTRIAL APPLICABILITY

The present invention makes it possible to provide a polishing pad with which a back surface of a silicon wafer can be polished and a gettering layer can be formed. Accordingly, the present invention is extremely industrially useful.

The invention claimed is:
1. A polishing pad comprising:
 a resin-containing polishing cloth having a polishing cloth base impregnated with a polyurethane resin and silicon carbide, wherein
 the silicon carbide has a particle diameter in a range from 0.2 to 1.5 μm, and
 the content of the silicon carbide in the resin-containing polishing cloth is in a range from 90 to 350 parts by mass relative to 100 parts by mass of the polishing cloth base.
2. The polishing pad according to claim 1, which is used to wet-polish a back surface of a semiconductor wafer.

3. The polishing pad according to claim 1, wherein the content of the polyurethane resin in the resin-containing polishing cloth is in a range from 10 to 500 parts by mass relative to 100 parts by mass of the polishing cloth base.

4. The polishing pad according to claim 1, wherein the polishing cloth base is a nonwoven fabric.

5. The polishing pad according to claim 1, further comprising a cushion layer laminated on a surface of the resin-containing polishing cloth on a side opposite from a polishing surface of the resin-containing polishing cloth.

6. A method for manufacturing the polishing pad according to claim 1, comprising the steps of:
preparing a polyurethane resin solution containing a polyurethane resin and silicon carbide;
impregnating a polishing cloth base with the polyurethane resin solution; and
immersing the polishing cloth base impregnated with the polyurethane resin solution in a coagulation liquid to coagulate the polyurethane resin.

7. The polishing pad according to claim 1, wherein the silicon carbide has a particle diameter in a range from 0.3 to 0.8 μm.

8. The polishing pad according to claim 1, wherein the resin-containing polishing cloth has an A hardness of 50 to 85 degrees.

9. The polishing pad according to claim 1, which has a compression ratio of 0.5 to 20%.

10. The polishing pad according to claim 1, which has a compressive elastic modulus of 20 to 100%.

11. The polishing pad according to claim 1, wherein the resin is a polyurethane resin having a resin modulus of 3 to 70 MPa.

12. A polishing pad comprising:
a resin-containing polishing cloth having a polishing cloth base impregnated with a polyurethane resin and silicon carbide, wherein
the silicon carbide has a particle diameter in a range from 0.2 to 2.0 μm, and the content of the silicon carbide in the resin-containing polishing cloth is in a range from 90 to 350 parts by mass relative to 100 parts by mass of the polishing cloth base.

\* \* \* \* \*